United States Patent [19]

Mooney et al.

[11] Patent Number: 6,087,847

[45] Date of Patent: Jul. 11, 2000

[54] IMPEDANCE CONTROL CIRCUIT

[75] Inventors: Stephen R. Mooney; Matthew B. Haycock; Joseph T. Kennedy, all of Beaverton, Oreg.

[73] Assignee: Intel Corporation, Santa Clara, Calif.

[21] Appl. No.: 08/902,345

[22] Filed: Jul. 29, 1997

[51] Int. Cl.[7] .................... H03K 19/0175; H03K 19/003
[52] U.S. Cl. ............................ 326/30; 333/17.3; 326/86; 327/316
[58] Field of Search .................................. 326/83, 86, 30; 333/124, 173, 32; 327/312, 316, 323, 328, 108

[56] References Cited

U.S. PATENT DOCUMENTS

| | | | |
|---|---|---|---|
| 5,134,311 | 7/1992 | Biber et al. | 327/108 |
| 5,254,883 | 10/1993 | Horowitz et al. | 326/30 |
| 5,457,407 | 10/1995 | Shu et al. | 326/30 |
| 5,666,078 | 9/1997 | Lamphier et al. | 327/108 |
| 5,726,583 | 3/1998 | Kaplinsky | 326/30 |
| 5,783,955 | 7/1998 | Shibata et al. | 327/108 |
| 5,872,471 | 2/1999 | Ishibashi et al. | 327/98 |

OTHER PUBLICATIONS

DeHon, A., T. Knight, Jr., and T. Simon, "Automatic Impedance Control", *ISSCC Digest of Technical Papers*, Feb. 1993, pp. 164–165.

Gabara, T.J. and S.C. Knauer, "Digitally Adjustable Resistors in CMOS for High–Performance Applications", *IEEE Journal of Solid State Circuits*, vol. 27, No. 8, Aug. 1992, pp. 1176–1185.

Knight, Jr., T.F. and A. Krymm, "A Self–Terminating Low–Voltage Swing CMOS Output Driver", *IEEE Journal of Solid State Circuits*, vol. 23, No. 2, Apr. 1988, pp. 457–464.

Kushiyama, N. et al., "A 500–Megabyte/s Data–Rate 4.5M DRAM", *IEEE Journal of Solid State Circuits*, vol. 28, No. 4, Apr. 1993, pp. 490–498.

*Primary Examiner*—Michael Tokar
*Assistant Examiner*—Richard Roseen
*Attorney, Agent, or Firm*—Howard A. Skaist

[57] ABSTRACT

Briefly, in accordance with one embodiment of the invention an integrated circuit includes: a digital feedback control circuit to adjust the impedance of an interface circuit output buffer based, at least in part, on having adjusted the impedance of a non-data signal output buffer coupled to an external impedance. Briefly, in accordance with another embodiment of the invention, a method of digitally adjusting the impedance of an interface circuit output buffer comprises: digitally adjusting the impedance of a non-data signal output buffer coupled to an external impedance, and digitally adjusting the impedance of the interface circuit output buffer based, at least in part, on the digitally adjusted impedance of the non-data signal output buffer.

17 Claims, 8 Drawing Sheets

IMPEDANCE CONTROL CIRCUIT

BACKGROUND OF THE INVENTION

1. Field of the Invention

The present invention relates to an impedance control circuit and, more particularly, to control circuits to adjust a circuit component impedance based, at least in part, on the impedance of an external coupling.

2. Background Information

Circuitry to interface between components of a digital system, such as for a microprocessor system or a server system, for example are well-known. However, increasing signal speeds, such as on the order of 500 megabit transfers per second, have made these interface circuits increasingly complex. For example, due to increasing signal speeds, it may be desirable to match impedances between components of the system, such as between a transmitting amplifier and a controlled impedance signal coupling in a server system, to reduce the amount of signal reflection that may occur.

Impedance control circuits, such as described above, are well-known. However, it would be desirable to have an economic on-chip implementation of a feedback control circuit in which the circuit impedance being adjusted or controlled may be updated even while digital signal samples are being transmitted via the interface circuitry.

SUMMARY OF THE INVENTION

Briefly, in accordance with one embodiment of the invention an integrated circuit includes: a digital feedback control circuit to adjust the impedance of an interface circuit output buffer based, at least in part, on having adjusted the impedance of a non-data signal output buffer coupled to an external impedance.

Briefly, in accordance with another embodiment of the invention, a method of digitally adjusting the impedance of an interface circuit output buffer comprises: digitally adjusting the impedance of a non-data signal output buffer coupled to an external impedance, and digitally adjusting the impedance of the interface circuit output buffer based, at least in part, on the digitally adjusted impedance of the non-data signal output buffer.

BRIEF DESCRIPTION OF THE DRAWINGS

The subject matter regarded as the invention is particularly pointed out and distinctly claimed in the concluding portions of the specification. The invention, however, both as to organization and method of operation, together with objects, features and advantages thereof, may best be understood by a reference to the following detailed description when read with the accompanying drawings in which:

DETAILED DESCRIPTION OF THE INVENTION

In the following detailed description, specific details are set forth in order to provide a thorough understanding of the invention. However, it will be understood by those skilled in the relevant art that the present invention may be practiced without these specific details. In other instances, well-known methods, procedures, components, and circuits have not been described in detail so as not to obscure the present invention.

As silicon processing technology advances, the speed of logic components made from silicon continues to increase. As a result, it is desirable to have high speed interface circuitry to transfer electrical signals, such digital signals, into and out of integrated circuit chips capable of operating at these increased speeds. To transmit high speed electrical signals with interface circuitry, it is desirable that a properly terminated, controlled impedance circuit be employed. Termination circuits or structures to accomplish this may be implemented either on-chip or off-chip; however, typically, on-chip termination techniques provide cost and speed advantages over off-chip termination techniques.

Figure 1:
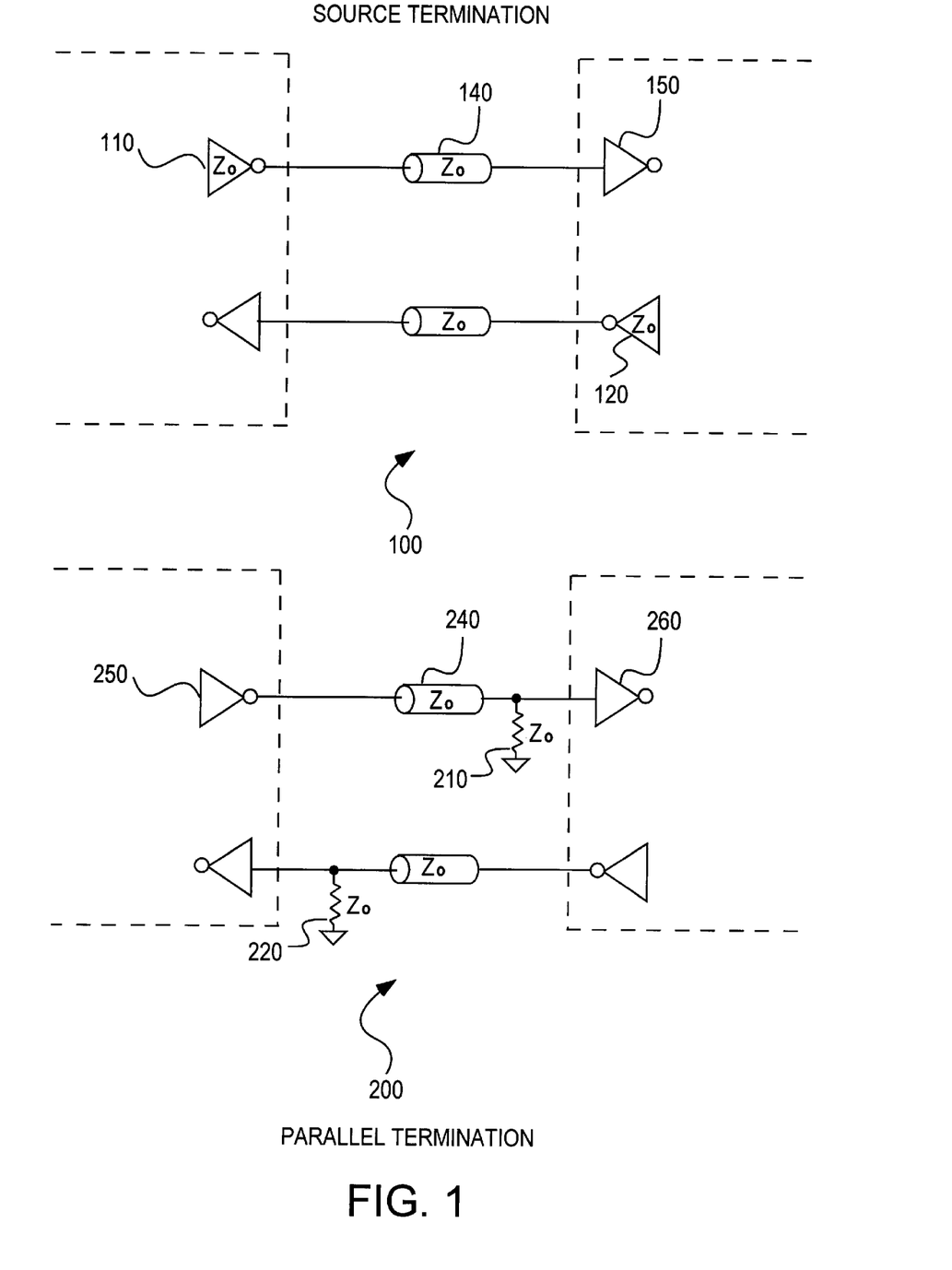
FIG. 1 is a schematic diagram illustrating two alternative methods of termination.

FIG. 1 is a schematic diagram illustrating both source and parallel termination approaches. Either approach may be employed to implement an embodiment in accordance with the present invention; however, the embodiment described hereinafter is implemented as a source termination circuit to capture cost and speed advantages that may be available with that approach. As illustrated in FIG. 1, in both approaches, electrical signals, such as digital signals in this particular embodiment, are communicated from a source driver, such as 110 or 250, to a destination driver, such as 150 or 260. Likewise, these signals are transmitted via a coupling, such as 140 or 240 having an impedance $Z_O$. Performance is improved relative to alternative approaches if the well-known technique of impedance matching is employed. By matching the impedance of coupling 140 or 240, electrical signals that may be reflected by the destination driver are properly terminated. In this context, this means that substantially no electrical signal reflections occur at the source end of the coupling.

As illustrated in FIG. 1, a source termination approach or a parallel termination approach may be employed. In a source termination approach, the impedance of the coupling, such as 140, is matched by the impedance of the source driver, such as 110. In a parallel termination approach, the impedance is matched via a coupling of the matching impedance, such as 210, to the impedance of the coupling being matched, such as 240.

Figure 7:
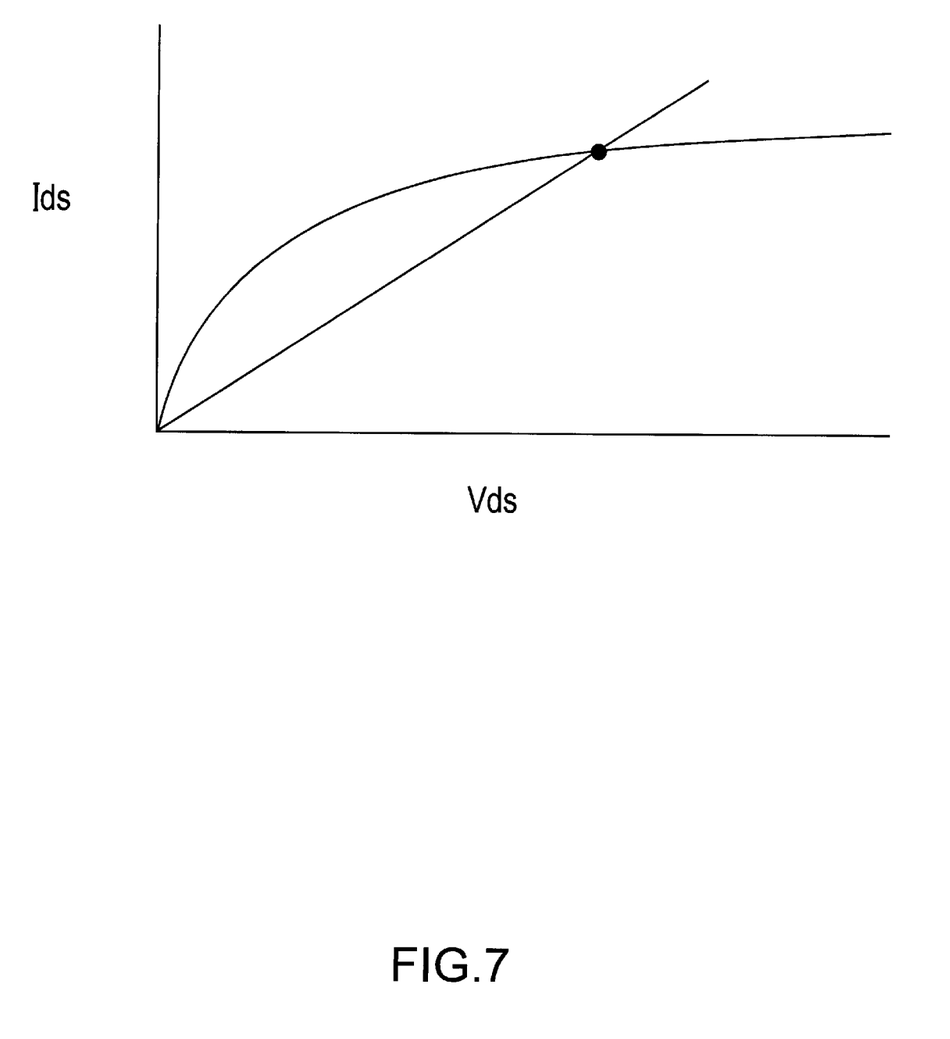
FIG. 7 is a plot showing the current vs. voltage (I/V) characteristic of a typical metal-oxide semiconductor (MOS) transistor.

Although the invention is not limited in scope in this respect, interface circuitry may be employed in association with a signal bus, for example, for operation in either a desktop personal computer or a server configuration, for example. To obtain speeds that may be desirable for server applications, for example, impedance matching, such as previously described, may be employed. However, as previously indicated, cost and speed factors may make use of the parallel termination approach on a board or elsewhere less desirable than the source termination approach. Therefore, in this particular embodiment, for example, the impedance of a driver may be matched to the impedance of an external coupling to a network, for example, to achieve these desirable signal speeds.

Where metal-oxide semiconductor (MOS) technologies are employed, impedance matching may involve matching a given impedance to the impedance associated with a particular point on a nonlinear current-voltage (I/V) characteristic curve representing the operation of an MOS transistor. Such a characteristic curve is associated with an MOS transistor where the drain-to-source current is plotted along the Y-axis versus the drain-to-source voltage plotted along the X-axis, as illustrated in FIG. 7.

A number of approaches may be employed to perform this impedance matching and the scope of the invention is not limited to a particular approach, such as restricting the range of operation of an MOS transistor or employing a circuit to at least approximately linearize the operation of an MOS transistor; however, for this particular embodiment, due to ease of implementation, instead, the impedance to be matched will be matched to a selected point on the MOS transistor current vs. voltage (I/V) characteristic curve. Such an approach permits an inverting complementary metal-oxide semiconductor (CMOS) buffer to be used as an output buffer. However, one disadvantage is that noise sources resulting in transitions to other portions of the I/V curve, such as the saturation region of operation of the transistor, will not be properly terminated and, therefore, may contribute to intersymbol interference.

Approximating the impedance of an external coupling by the impedance of a CMOS output buffer may be done in a number of ways. For example, cascoded devices or series gating may be employed. The circuits may be implemented to allow either digital or analog control. For this particular embodiment, although the invention is not limited in scope in this respect, a digital approach is employed due to the potentially noisy environment for the electronic signals.

In one embodiment, although the invention is not limited in scope in this respect, a circuit may be implemented using cascoded devices in series with a primary output amplifier to adjust or control the effective impedance of the overall structure. The cascode devices may include multiple, parallel couplings that may be individually enabled.

Figure 3:
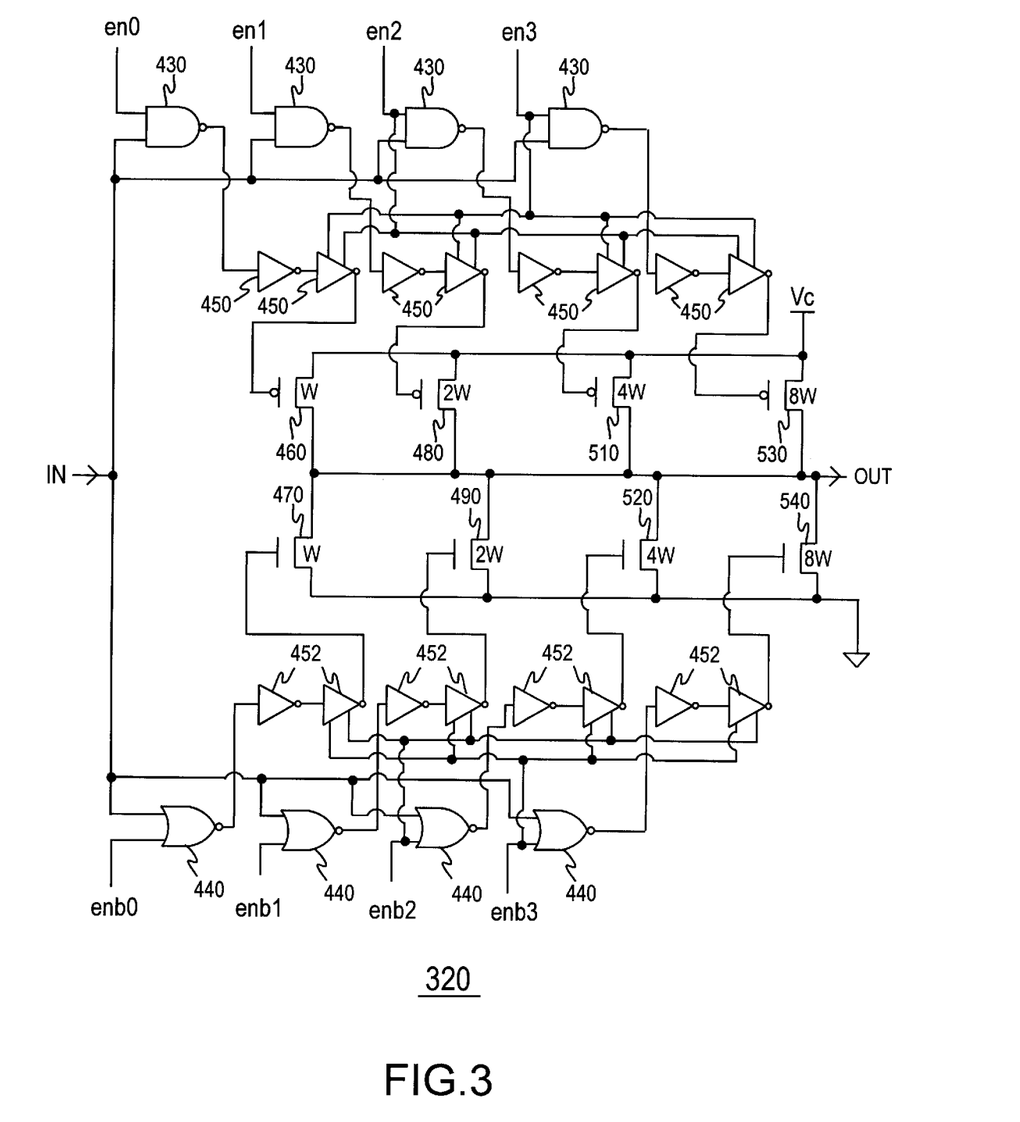
FIG. 3 is a circuit diagram illustrating the output buffer of FIG. 2 in greater detail.

The weighting of these devices to adjust the effective impedance of the output buffer may be accomplished in a variety of ways, although the invention is not limited in scope to any particular approach. Two frequently employed approaches include binary weighting and linear weighting. Although overall device size may affect the available range of impedances that may be implemented, the resolution of the impedance may be affected by the size of the smallest device, such as illustrated in FIG. 3, for example. One advantage of binary weighting is that it permits a larger impedance range for a given resolution in comparison with linear weighting; however, as will be explained in more detail hereinafter, it has disadvantages with respect to "on-the-fly" updating of the impedance.

As previously described, an alternative approach may employ using series gating to adjust or control the impedance of the output buffer. This particular approach is employed in the embodiment illustrated in FIG. 3, although the invention is not limited in scope to this particular approach. The particular approach employed to implement the output buffer may affect additional implementation considerations including the size of the smallest leg, such as due to electrostatic discharge (ESD) sensitivity, and, likewise, the area of the chip employed by the particular buffer. For example, a cascoded approach employs a relatively large area in comparison with a series gated approach.

As illustrated in FIG. 3, the amplifier is a multi-legged device with the input signal being gated with enable signals for the individual legs. In this context, the term leg refers to the primary transistors employed to implement the amplifier configuration (e.g., 460, 470, 480, 490, 510, 520, 530 and 540). In comparison with a cascaded approach, the size of the overall amplifier is reduced. However, a speed penalty will be incurred because the predrivers, such as 430 or 440, are more complex, which introduces additional delay.

Figure 8:
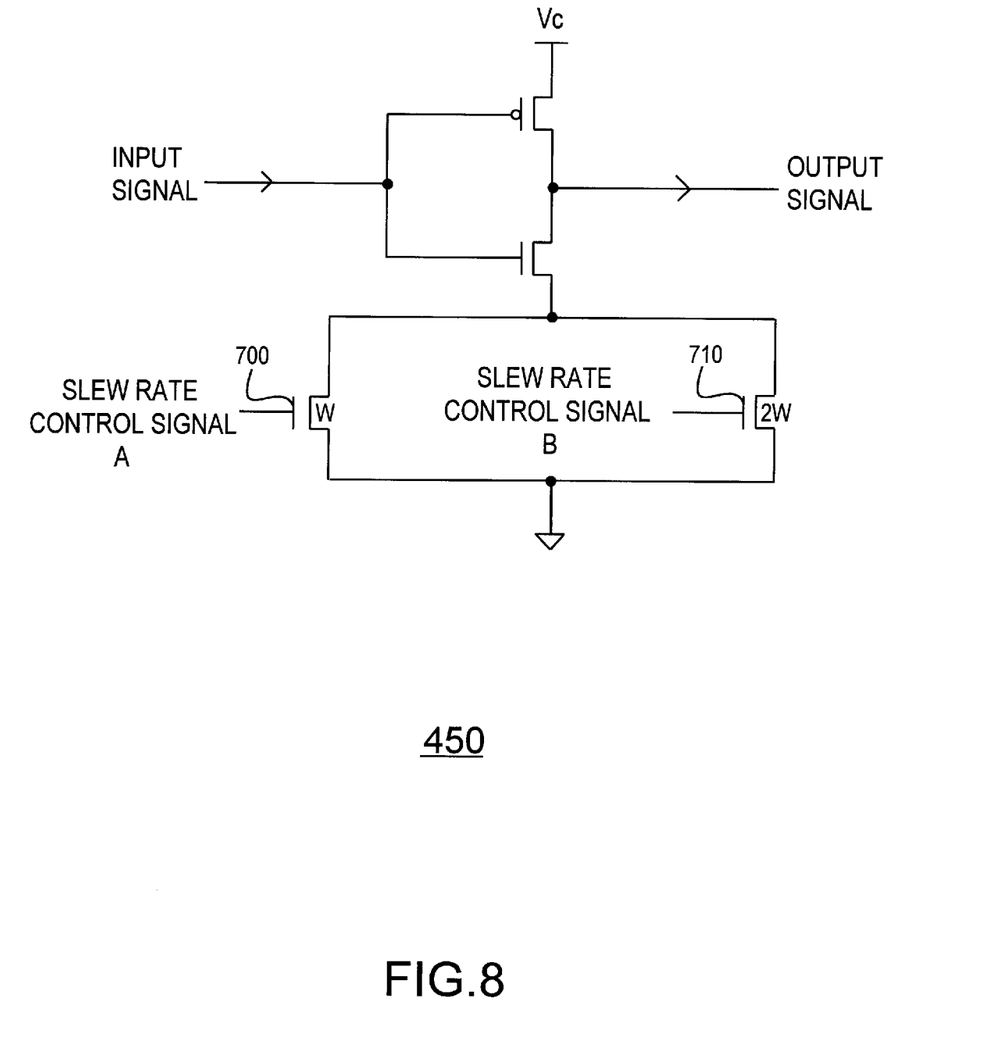
FIG. 8 is a circuit diagram illustrating a portion of the embodiment of FIG. 3 in greater detail.

The slew rate for the electronic digital signals produced may also be adjusted or controlled. Again, a variety of techniques may be employed, including analog techniques and digital techniques. For the embodiment illustrated in FIG. 3, impedance and slew rate adjustment are both incorporated. In this particular embodiment, a subset of the impedance control couplings are employed to control slew rate. This particular approach reduces the control circuitry and coupling in comparison with an approach in which both impedance control and slew rate control are into the same buffer. In this particular embodiment, a 4-bit control scheme with a 2-bit slew rate control of the 4-bits is employed. Slew rate adjustment may be accomplished, for example, using parallel legs on the predriver for the side of the device that turns on or produces the electrical digital output signal. For example, for a PMOS predriver, the N-device has multiple legs. As shown in FIG. 8, which is a detailed view of 450, devices 700 and 710 have been added in cascode with the predriver N-type MOS (NMOS) device. Inverters 452 may employ a similar approach using PMOS devices. Devices 700 and 710 in FIG. 8 are used to control the impedance of the predriver in an approach similar to the approach used to control as the impedance of the output buffer with devices 460, 470, etc.. This impedance driving the capacitance of the output buffers, such as due to devices 460, 470, etc., limits the slew rate of the output buffer. Only the output buffer turn-on slew rate is controlled in this embodiment because the output buffer is meant to be used in a source-terminated configuration. Alternatively, if a parallel termination embodiment were employed, the turn-off slew rate would also be controlled due at least in part to static current in the coupling.

For the embodiment of an output buffer illustrated in FIG. 3, en3 and en2 are employed for slew rate adjustment. An offset value between the nominal values for impedance adjustment and slew rate adjustment may be employed in the control logic, as described in more detail hereinafter. Therefore, if the impedance of the predriver is well-controlled, the slew rate of the driver may be tightly controlled as well.

A digital control loop may be employed to compensate a digitally controllable buffer, such as previously described, for variations in process and environment, for example. Although the previously described digitally controllable buffer may be employed, it will, of course, be appreciated that the invention is not limited in scope to the particular embodiment described. Any digitally controllable buffer or even a controllable buffer that is not controllable digitally may be employed. Since noise is present at the signal sampling interface illustrated in FIG. 4, it is desirable to limit the loop bandwidth to reduce the sensitivity to this noise. A filter may be implemented in a variety of ways, such as at the sampling pin, in this embodiment, the interface of 330, 340, and 360, or in control logic block 310, to limit the loop bandwidth. Another advantage is that this permits the use of relatively slow circuit components, and permits the lowering of the sampling rate to allow for metastability settling time, as will be described later.

Figure 2:
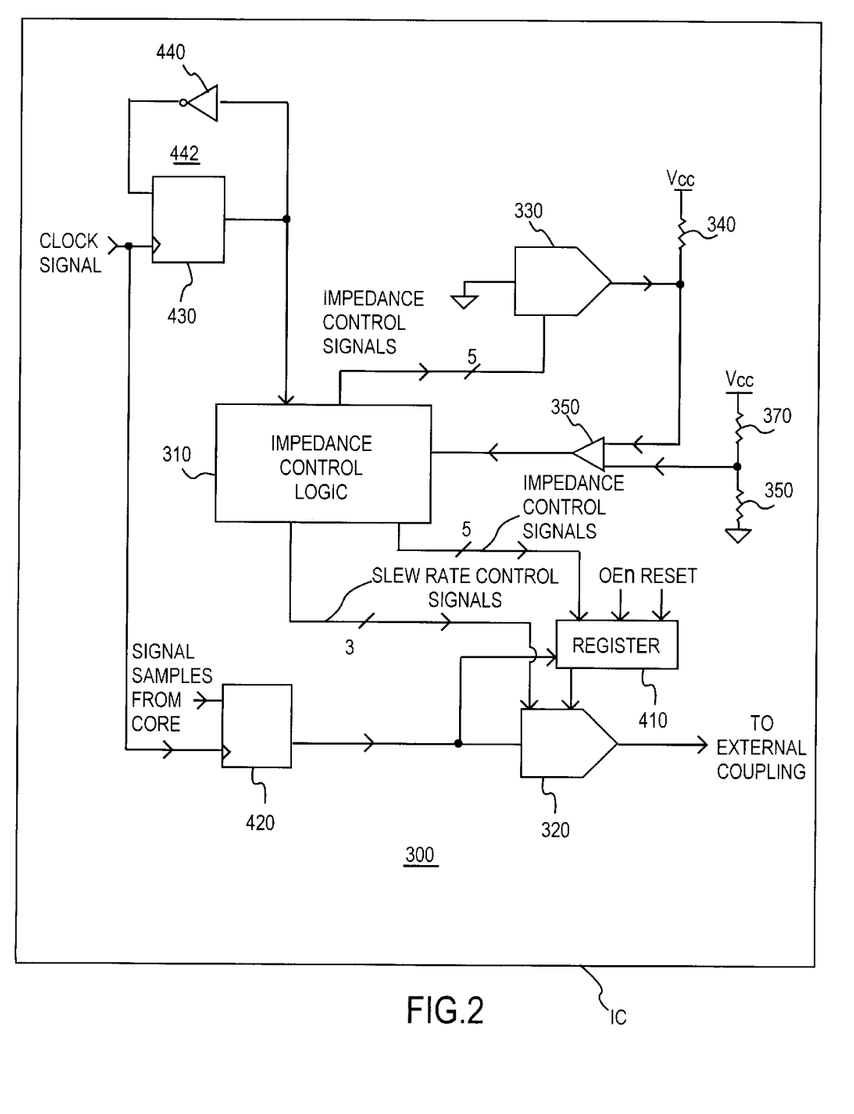
FIG. 2 is a block diagram illustrating an embodiment of an impedance control circuit in accordance with the invention.

FIG. 2 is a schematic diagram illustrating an embodiment 300 of an impedance control circuit in accordance with the invention, although the invention is not limited in scope to this particular embodiment. Embodiment 300 is illustrated as embodied on an integrated circuit (IC) chip, although the invention is not limited in scope in this respect. As illustrated, an externally derived clock signal drives the control circuit; however, it is divided down by divider 442. Output buffer 320 comprises an interface circuit output buffer, while output buffer 330 comprises a non-data signal or "dummy" output buffer. A feedback control loop including amplifier 360 and impedance control logic 310 is coupled to adjust the impedance of output buffer 330 based, at least in part, on the impedance of external coupling 340. The feedback control circuit operates to approximately match the impedance of buffer 330 with, in this particular embodiment, the impedance of external resistor 340. Likewise, in this embodiment, resistors 370 and 350 effectively establish the voltage signal reference level for amplifier 360. Impedance control logic 310 based, at least in part, on the output signal of amplifier 360 controls whether to adjust the impedance of buffer 330 up or down, that is increase or decrease the buffer impedance. Likewise, this control signal information is also applied to buffer 320. The feedback control circuit also produces control signals to adjust the slew rate of buffer 320 based on the impedance control signals produced from operation of the feedback loop including buffer 330. Likewise, register 410 is employed so that buffer 320 may be updated "on-the-fly," as explained in more detail hereinafter.

Figure 4:
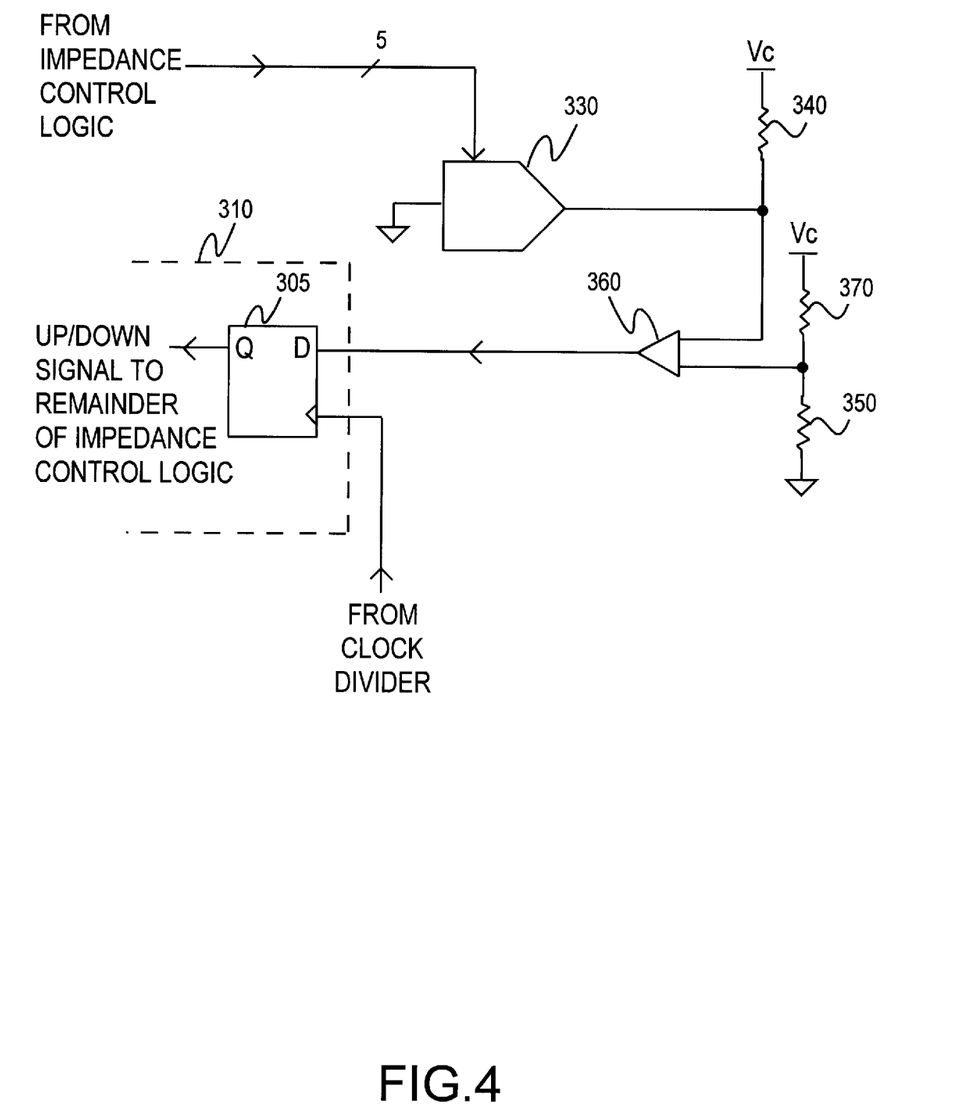
FIG. 4 is a block diagram illustrating a portion of the embodiment of FIG. 2 in greater detail.

FIG. 4 illustrates a portion of the embodiment of FIG. 2. For the portion of the embodiment illustrated in FIG. 4, a precision external resistor 340 is coupled to an output port of non-data signal (dummy) output buffer 330. The impedance value obtained for buffer 330 due to the operation of the feedback circuit previously described is then used to adjust the impedance of output buffer 320. For the feedback circuit of this embodiment, a reference voltage signal level for amplifier 360 is generated. This reference voltage signal level is implemented in this embodiment by resistors 350 and 370 in FIG. 4. This sets the threshold for amplifier 360. This reference value effectively sets the point on the MOS transistor I/V characteristic to which the impedance of buffer 330 is matched. Resistor 340 is selected by approximating the nominal value of the external coupling to buffer 320. Of course, alternatively, an externally derived coupling may be employed in place of resistor 340 or another approach may be employed.

The feedback control circuit in this embodiment operates as follows. A sample impedance signal value is taken by input latch 305. A first predetermined period of time elapses to allow any metastabilities in the latch to settle. Based upon the signal sample value obtained and the impedance of buffer 330 in relation to resistor 340, a determination regarding which direction to adjust the impedance of buffer 330 is made, that is to increase or decrease the impedance. This may be implemented in 310, for example, by adjusting the value of an up/down counter or a shift register to control the impedance of buffer 330, as explained later. Therefore, impedance control logic 310 generates signals applied to buffer 330 to produce the next impedance value. Another second predetermined amount of time elapses for the change in the adjusted impedance value to settle at the output port of buffer 330 and propagate through input amplifier 360. This process is repeated until the impedance, resistor 340 in this particular embodiment, has been matched, as desired. At this point, in this particular embodiment, control circuit 310 results in the impedance of buffer 330 varying by plus or minus a least significant control bit about the desired impedance value.

The time to allow for metastability settling and for settling of the transition of output buffer 330 is provided in this embodiment by a clock divider, as illustrated in FIG. 4. As illustrated, logic in the control loop is clocked by this divided down clock signal. It is desirable to set the clock or sampling rate to obtain a reasonably low sampling error rate due to metastable states in input latch 305. These metastabilities may occur from noise on the dummy pin at any time with respect to the clock, and may, therefore, violate the setup and hold conditions of latch 305. Computation of the mean time between failures of a latch involves parameters such as the process technology, latch design, allowable settling time, and probability distribution of the latch data edge timing with respect to the clock. Using acceptable bounds for these parameters, and an allowable error rate, an acceptable settling time may be calculated. For example, for a latch which samples uniformly distributed asynchronous data signals (and making some simplifying assumptions) at a frequency of approximately 433 Megahertz, it is desirable to divide the clock by at least two generated sampling clock pulses, although the invention is not limited in scope in this respect. Thus for this embodiment, divider 442 provides an acceptable settling time for the target process, although the invention is not limited in scope in this respect.

Figure 5:
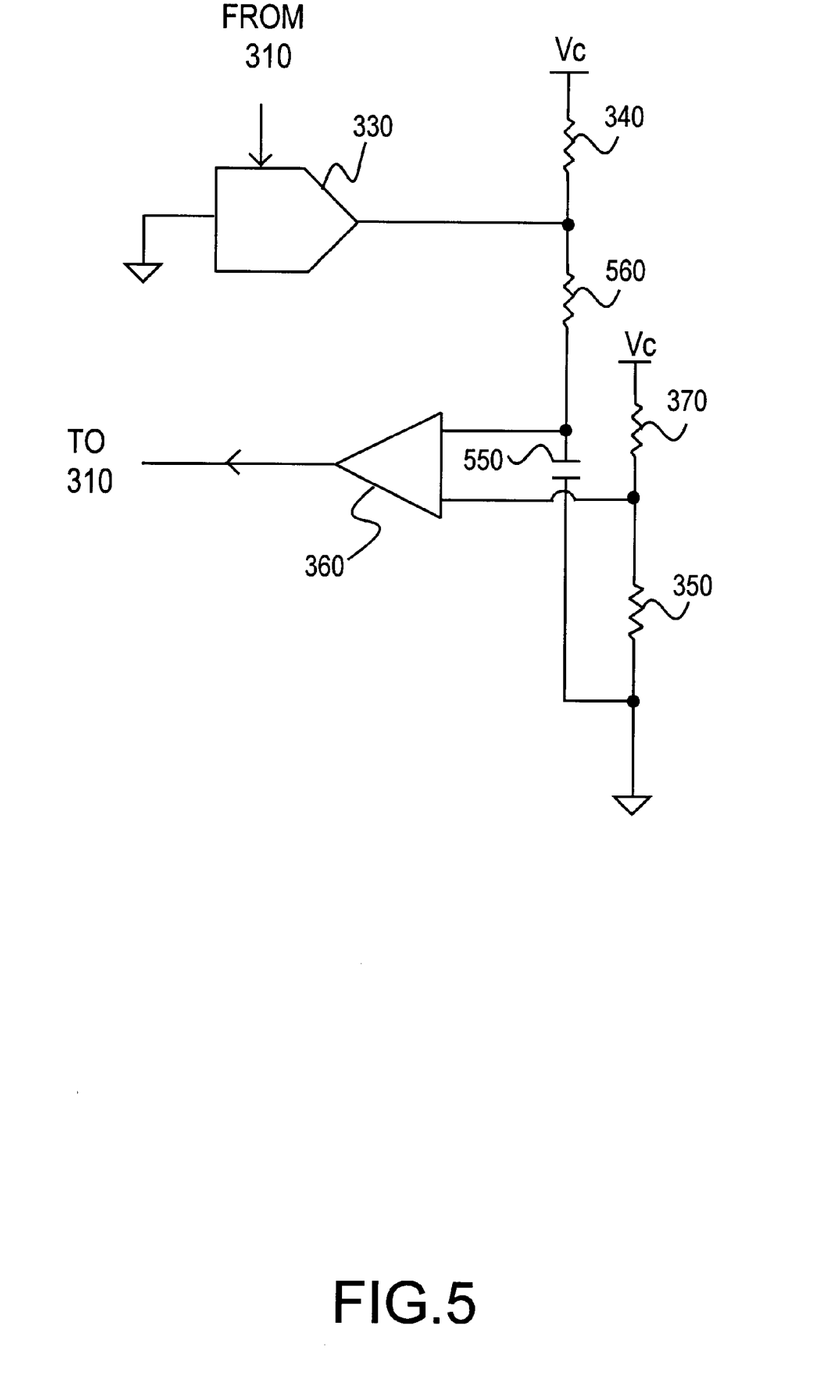
FIG. 5 is a block diagram illustrating a portion of the embodiment of FIG. 2 in greater detail.

Another aspect of this embodiment involves filtering frequencies greater than half the sampling rate to reduce the noise sources occurring at, or greater than, the Nyquist rate. These frequencies might otherwise result in aliasing. FIG. 5 illustrates the filter employed in this embodiment, although, again, the invention is not limited in scope to employing a filter or to this particular embodiment. Likewise, in placing the pole of the filter, it is desirable to avoid instabilities. Therefore, it is desirable to update the impedance at a lower rate than the bandwidth of the loop to allow the loop time to settle after an update. In this particular embodiment, the pole of the analog filter is placed at less than half the sampling frequency, but at least two times the update rate, although the invention is not limited in this respect. In the time domain response, therefore, after the impedance is updated, the next sampling event occurs after two filter time constants. Of course, a greater number of filter time constants before the next sampling event may be employed, however, doing so would also increase the control loop lock time.

Figure 6:
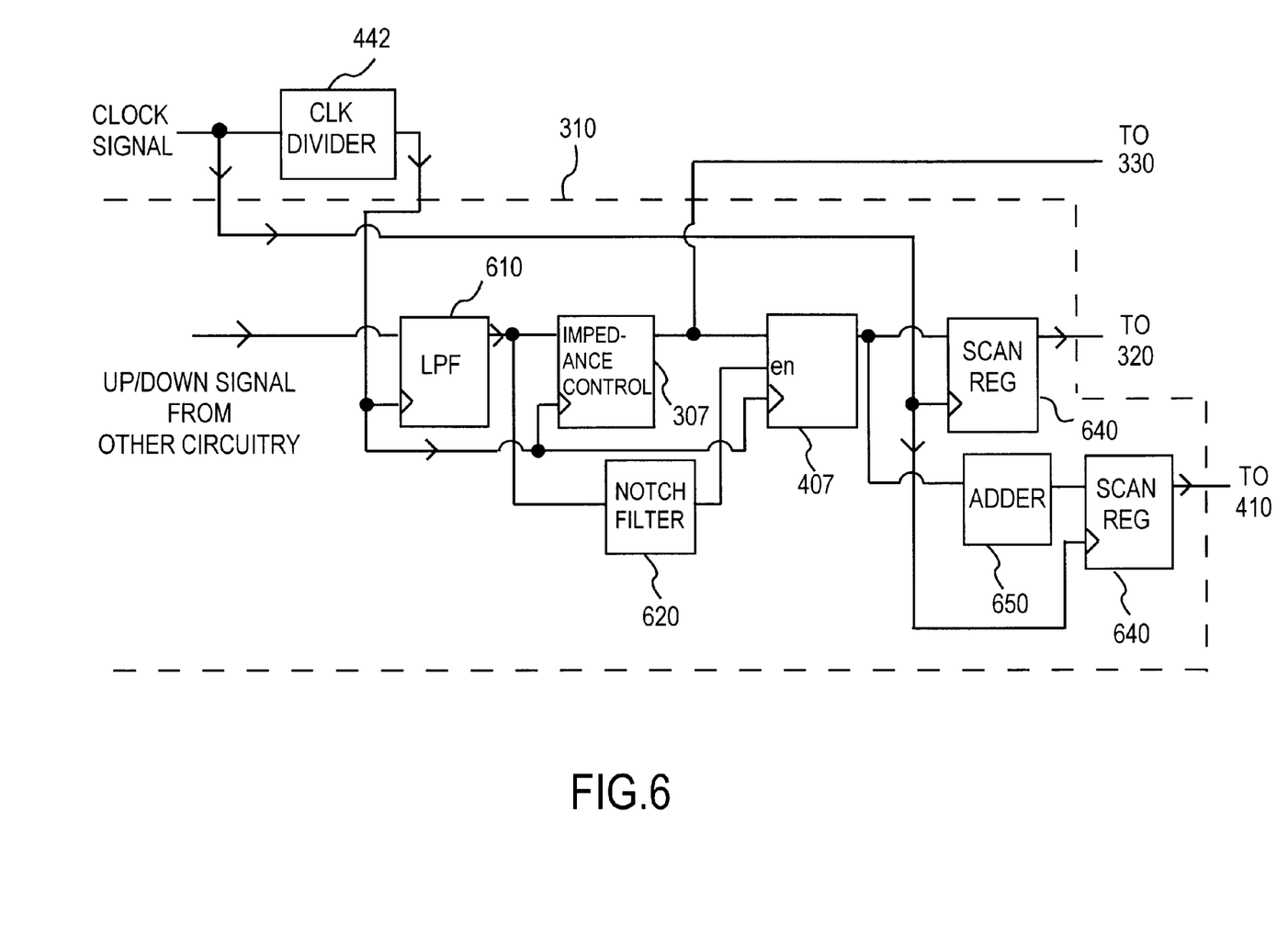
FIG. 6 is a block diagram illustrating a portion of the embodiment of FIG. 2 in greater detail.

Due to the operation of the control loop and a situation in which the impedance of output buffer 320 may not precisely match, the control loop should lock with a one-bit variation from the matching point and, therefore, oscillate. It is desirable to remove this oscillation from the actual output signal produced by buffer 320. Although this may be accomplished a number of different ways, a simple digital notch filter may be employed. For example, a simple, exclusive or circuit may be employed. If successive digital sample values are the same then an update of buffer 320 is performed, however, if successive samples are not the same, then the last update is retained by buffer 320. This particular embodiment is illustrated in FIG. 6. As illustrated, impedance control block 310 provides signals to output buffer 330. Likewise, the output signals of low pass filter 610 are provided to notch filter 620. Notch filter 620 provides a signal to block 407. Depending on the successive samples provided to notch filter 620, the impedance control signals produced by 310 are also provided by block 407 to register 640 and, therefore, to register 410 and ultimately to buffer 320.

The implementation of impedance control block 307 is dependent, at least in part, on the weighting of the output buffer legs. For example, if the devices are linearly weighted, a shift register may be employed. However, if they are binary weighted, this block may be implemented as an up/down counter. For a linearly weighted buffer, one bit of a shift register would change on each impedance update, changing the impedance of the buffer by a substantially uniform amount. For a binary weighted buffer, a counter is updated, producing another binary digital signal value controlling the buffer impedance. In such an embodiment, therefore, all bits of the counter may change on a single impedance update. As illustrated in FIG. 6, adder 650 is used to offset the nominal slew rate value from the nominal impedance value. This offset value may be set either internally or externally by a variety of techniques. For example, the offset value may be loaded into a register from an external source, or alteratively, it may be implemented with fuses. For example, if it were intended to use the same output buffer to match several alternative impedances, and it were desirable to maintain a substantially constant slew rate, it would be desirable to be able to modify this offset value.

As previously described, this embodiment includes the capability to adjust the impedance of the output buffer while the output buffer is transmitting data signals. One problem with this "on-the-fly" updating is that if the update occurs temporally near an outgoing data signal edge, for example, it may alter the timing of the edge. This may produce undesirable timing jitter. For example, for the case of a binary weighted output buffer with five legs, a significant change in the impedance of the output buffer may occur in a single clock cycle. With linear encoding, because only one bit at a time changes, the impact of this effect is reduced. However, linear encoding provides a smaller range of impedance values. Likewise, where slew rate control is employed, an additional problem may result because after a large change in impedance, some output buffer legs may turn on relatively slowly due to slew rate control. This may occur in this embodiment since, for source terminated buffers, "turn off" of a leg is done quickly, while "turn on" of a leg is done slowly to implement slew rate control. For example, the impedance control signal values from 310 may change from 1000 to 0111 on a single impedance update. If the most significant bit changes first, the buffer may tristate momentarily. If non-zero current was in the signal transmission coupling when the buffer tristated, the line will switch. The remaining impedance control bits will then switch, turning the buffer back on and returning the coupling approximately to it's original state, but slowly. The line, therefore, glitches. This may degrade performance if the output buffer is transmitting data signals while this occurs.

For the embodiment illustrated in FIG. 8, on-the-fly updating is performed by updating while the output buffer is in tri-state or by updating the "off" or non-transmitting side of the CMOS output buffer (for example, in this embodiment, the NMOS devices while the output signal is high, and the PMOS devices while the output signal is low). To implement this approach, latches are employed at each individual leg of the output buffer using register 410 of FIG. 2, in this embodiment, for example. The latches used in register 410 are replicated at each signal output port; however, these latches may be relatively small. For the embodiment illustrated in FIG. 2, signals RESET and OEn are employed so that "on-the-fly" updating occurs during tri-state or reset. Although the invention is not limited in scope in this respect, in this particular embodiment on-the-fly updating is employed only for the impedance of the output buffer. For an application in which resolution of the slew rate control is relatively coarse, the slew rate control may be operated for a few clock cycles after reset to remove process variations, for example, and then the slew rate value may be locked. Alteratively, on-the-fly updating of the slew rate may likewise be employed, although this may also create timing jitter.

An embodiment of a method of adjusting an impedance of an interface circuit output buffer, such as output buffer 320 illustrated in FIG. 2, may be accomplished as follows. As previously described, the impedance of a non-data signal output buffer, such as output buffer 330 in FIG. 2, coupled to an external impedance, such as resistor 340 in FIG. 2, may be digitally adjusted. The impedance of an interface circuit output buffer, such as output buffer 320 in FIG. 2, may be digitally adjusted based, at least in part, on digitally adjusted impedance of the non-data signal output buffer. Likewise, the impedance of the interface circuit output buffer may also be digitally adjusted based, at least in part, on the digital adjustment of the impedance of the non-data signal output buffer. Again, this has been previously described in connection with output buffer 320, as illustrated in FIG. 2. Likewise, the impedance of the interface circuit output buffer may be digitally adjusted on-the-fly. For example, in the embodiment illustrated in FIG. 2 the impedance of the non-transmitting side of the interface circuit output buffer may be digitally adjusted on-the-fly.

As previously described, digitally adjusting the impedance of the non-data signal output buffer comprises approximately matching the impedance of the non-data signal output buffer, such as buffer 330 in FIG. 2, with the impedance of the external coupling, such as resistor 340 in FIG. 2. Likewise, in this particular embodiment, although the invention is not limited in scope in this respect, the impedance of the non-data signal output buffer is digitally adjusted so that the external impedance is source terminated. Likewise, digitally adjusting the impedance of a non-data signal output buffer coupled to an external impedance comprises digitally adjusting the impedance in binary weighted increments, although, again, the invention is not limited in scope in this respect.

While certain features of the invention have been illustrated as described herein, many modifications, substitutions, changes and equivalents will now occur to those skilled in the art. It is, therefore, to be understood that the appended claims are intended to cover all such modifications and changes as fall within the true spirit of the invention.

We claim:

1. An integrated circuit comprising:
   a digital feedback control circuit to adjust the impedance of an interface circuit output buffer based, at least in part, on having adjusted the impedance of a non-data signal output buffer coupled to an external impedance.

2. The integrated circuit of claim 1, wherein said digital feedback control circuit also includes the capability to adjust the slew rate of said interface circuit output buffer.

3. The integrated circuit of claim 2, wherein said digital feedback control circuit includes the capability to adjust the impedance of said interface circuit output buffer on-the-fly.

4. The integrated circuit of claim 3, wherein the capability to adjust the impedance of said interface circuit output buffer on-the-fly comprises the capability to adjust the impedance of the non-transmitting side of said interface circuit output buffer on-the-fly.

5. The integrated circuit of claim 3, wherein said digital feedback control circuit to adjust the impedance of said interface circuit output buffer comprises a digital feedback control circuit to approximately match the impedance of said non-data signal output buffer with the impedance of the external coupling.

6. The integrated circuit of claim 1, wherein said external coupling comprises at least one resistor.

7. The integrated circuit of claim 1, wherein said digital feedback control circuit comprises a source termination digital feedback control circuit.

8. The integrated circuit of claim 1, wherein said interface circuit output buffer comprises an output buffer in which at least some of the transistors are series gated.

9. The integrated circuit of claim 1, wherein said interface circuit output buffer includes an amplifier configuration with a plurality of legs, said legs being sized so that their weighting to adjust the effective impedance of the output buffer is substantially binary.

10. A method of adjusting the impedance of an interface circuit output buffer comprising:

digitally adjusting the impedance of a non-data signal output buffer coupled to an external impedance;

and digitally adjusting the impedance of the interface circuit output buffer based, at least in part, on the digitally adjusted impedance of the non-data signal output buffer.

11. The method of claim 10, wherein digitally adjusting the impedance of the interface circuit output buffer includes also digitally adjusting the slew rate of the interface circuit output buffer.

12. The method of claim 10, wherein digitally adjusting the impedance of the interface circuit output buffer includes digitally adjusting the impedance on-the-fly.

13. The method of claim 12, wherein digitally adjusting the impedance of the interface circuit output buffer on-the-fly comprises digitally adjusting the impedance of the non-transmitting side of the interface circuit output buffer on-the-fly.

14. The method of claim 10, wherein adjusting the impedance of the non-data signal output buffer comprises approximately matching the impedance of the non-data signal output buffer with the impedance of the external coupling.

15. The method of claim 14, wherein the externally coupling comprises at least one resistor.

16. The method of claim 10, wherein digitally adjusting the impedance of a non-data signal output buffer coupled to an external impedance comprises digitally adjusting the impedance of the non-data signal output buffer so that the external impedance is source terminated.

17. The method of claim 10, wherein digitally adjusting the impedance of a non-data signal output buffer coupled to an external impedance comprises digitally adjusting the impedance in binary weighted increments.

* * * * *

UNITED STATES PATENT AND TRADEMARK OFFICE
CERTIFICATE OF CORRECTION

PATENT NO.    : 6,087,847
DATED         : July 11, 2000
INVENTOR(S)   : Mooney et al.

It is certified that error appears in the above-identified patent and that said Letters Patent is hereby corrected as shown below:

Column 7,
Line 15, delete "alteratively", insert -- alternatively --.

Column 8,
Line 2, delete "alteratively", insert -- alternatively --.

Signed and Sealed this

Fourth Day of June, 2002

Attest:

JAMES E. ROGAN
Attesting Officer      Director of the United States Patent and Trademark Office